(12) United States Patent
Kinoshita et al.

(10) Patent No.: US 10,658,901 B2
(45) Date of Patent: May 19, 2020

(54) COVER ASSEMBLY FOR ON-BOARD ELECTRIC EQUIPMENT AND METHOD OF MANUFACTURING THE COVER ASSEMBLY

(71) Applicant: KABUSHIKI KAISHA TOYOTA JIDOSHOKKI, Kariya-shi, Aichi-ken (JP)

(72) Inventors: Yusuke Kinoshita, Aichi-ken (JP); Junya Yano, Aichi-ken (JP); Shingo Enami, Aichi-ken (JP)

(73) Assignee: KABUSHIKI KAISHA TOYOTA JIDOSHOKKI, Kariya-shi, Aichi-ken (JP)

( * ) Notice: Subject to any disclaimer, the term of this patent is extended or adjusted under 35 U.S.C. 154(b) by 0 days.

(21) Appl. No.: 16/172,993

(22) Filed: Oct. 29, 2018

(65) Prior Publication Data
US 2019/0131848 A1   May 2, 2019

(30) Foreign Application Priority Data

Oct. 31, 2017  (JP) ................................ 2017-211410

(51) Int. Cl.
*H05K 7/00* (2006.01)
*H02K 5/22* (2006.01)
(Continued)

(52) U.S. Cl.
CPC ........... *H02K 5/225* (2013.01); *B60H 1/3229* (2013.01); *F04B 35/04* (2013.01); *F04B 39/121* (2013.01);
(Continued)

(58) Field of Classification Search
None
See application file for complete search history.

(56) References Cited

U.S. PATENT DOCUMENTS 9,350,228 B2 *   5/2016  Uetake .................. H02M 7/003
2003/0128535 A1 *  7/2003  Otani .................... H05K 9/0016
                                                          361/816
(Continued)

FOREIGN PATENT DOCUMENTS

CN    102916282 A    2/2013
CN    104602889 A    5/2015
(Continued)

*Primary Examiner* — Courtney L Smith
*Assistant Examiner* — Rashen E Morrison
(74) *Attorney, Agent, or Firm* — Sughrue Mion, PLLC

(57) ABSTRACT

A cover assembly for on-board electric equipment includes a cover body and a connector including a terminal and a connector housing. The cover body includes a ferrous base metal body, and a Zn-based plating layer formed on a surface of the base metal body. The cover body has a through hole formed through the base metal body and the plating layer. The terminal is passed through the through hole and electrically connected to an electric circuit. The connector housing is formed on the cover body so as to surround the terminal. A laser mark is formed on the cover body. The laser mark has a circular shape about the through hole and penetrates the plating layer to the base metal body. The connector housing extends to the base metal body through the plating layer within the laser mark.

6 Claims, 14 Drawing Sheets

(51) Int. Cl.
    *F04B 39/12*     (2006.01)
    *F04B 35/04*     (2006.01)
    *H02K 11/33*     (2016.01)
    *B60H 1/32*     (2006.01)
    *H02K 5/10*     (2006.01)

(52) U.S. Cl.
    CPC .............. *H02K 5/10* (2013.01); *H02K 11/33* (2016.01); *F04C 2240/808* (2013.01); *F05C 2201/0433* (2013.01); *F05C 2201/0496* (2013.01); *F05C 2201/903* (2013.01); *F05C 2225/08* (2013.01); *H05K 7/00* (2013.01)

(56) References Cited

U.S. PATENT DOCUMENTS

| | | | |
|---|---|---|---|
| 2013/0034975 A1 | 2/2013 | Yoshida et al. | |
| 2013/0088128 A1* | 4/2013 | Nakano | B62D 5/0406 310/68 R |
| 2013/0265808 A1* | 10/2013 | Ishii | H02M 7/003 363/97 |
| 2015/0256096 A1* | 9/2015 | Nishizawa | H01G 2/04 363/131 |
| 2015/0305188 A1* | 10/2015 | Maeda | H05K 7/1432 361/728 |
| 2015/0326090 A1 | 11/2015 | Arashi | |
| 2016/0181940 A1* | 6/2016 | Takahashi | H02M 7/003 361/752 |

FOREIGN PATENT DOCUMENTS

| | | |
|---|---|---|
| JP | 2014-034960 A | 2/2014 |
| JP | 2016-098664 A | 5/2016 |

\* cited by examiner

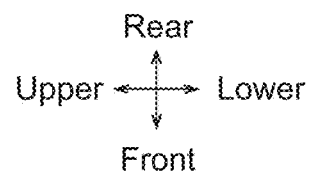
FIG. 3A
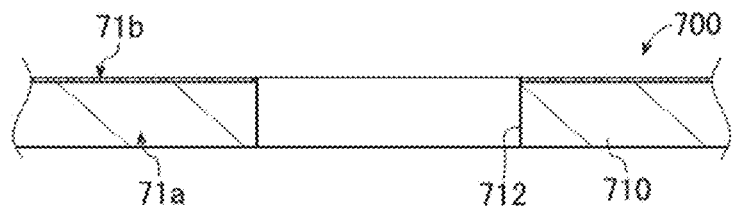
FIG. 3B
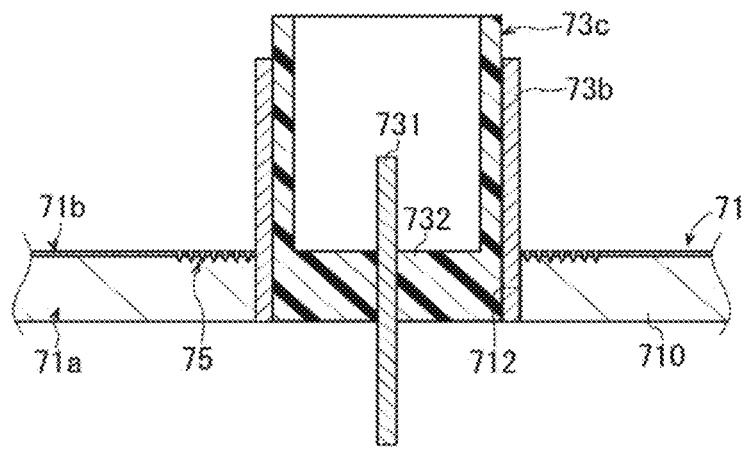
FIG. 3C
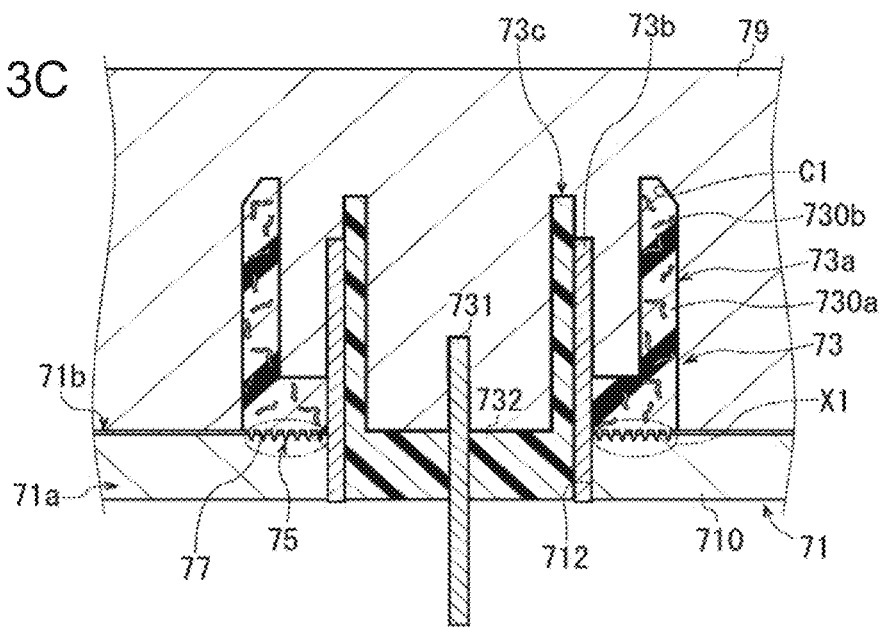

COVER ASSEMBLY FOR ON-BOARD ELECTRIC EQUIPMENT AND METHOD OF MANUFACTURING THE COVER ASSEMBLY

BACKGROUND ART

The present disclosure relates to a cover assembly for on-board electric equipment and a method of manufacturing the cover assembly.

Japanese Patent Application Publication Nos. 2014-34960 and 2016-98664 each disclose a cover for on-board electric equipment (hereinafter, simply referred to as the cover). More specifically, the covers disclosed in the Publications are used for on-board electric compressors.

According to Japanese Patent Application Publication No. 2014-34960, an electric circuit is accommodated in the cover. The cover is provided with a connector. The connector electrically connects the electric circuit in the cover to an external component outside the cover to thereby supply electric power to the electric circuit. The connector includes a terminal to be connected to the electric circuit and a connector housing that surrounds the terminal. The cover and the connector housing are joined and integrated at a joining region in the cover. The joining region includes an insertion hole that is formed in the connector housing, a threaded hole that is formed in the cover so as to be aligned with the insertion hole, and a bolt that is inserted in the insertion hole and tightened in the threaded hole.

According to Japanese Patent Application Publication No. 2016-98664, the cover is made of a metal and accommodates an electric circuit. The cover is provided with a connector. The connector also electrically connects the electric circuit in the cover to an external component outside the cover to supply electric power to the electric circuit. The connector includes a plurality of bus bars, first and second mount plates made of a metal. The cover and the connector are joined and integrated at a joining region in the cover. The joining region has a first insertion hole and a second insertion hole formed in the first mount plate and the second mount plate, respectively, threaded holes that are formed in the cover so as to be aligned with the first and second insertion holes, and bolts that are inserted in the first and second insertion holes and tightened in the threaded holes.

It is preferable that on-board electric equipment for vehicle be as small as possible so as to improve the mountability on vehicles. Reduction in the size of the covers is accordingly required. However, since the covers disclosed in Japanese Patent Application Publication Nos. 2014-34960 and 2016-98664 have through holes and threaded holes for bolts in the joining regions, areas for the through hole and the threaded holes for the bolts must be provided in the joining regions. Furthermore, the covers disclosed in the Publications require sealing members to be inserted between the cover and the connector so that airtightness is ensured between the cover and the connector. Thus, it is difficult to further reduce the size of the covers of the Publications.

In order to reduce the size of the covers, it may be attempted to form a resin-based connector housing on the cover using injection molding so that the cover and the connector housing are joined and integrated at the joining region. In such case, the joining region need not have space for through holes and threaded holes for bolts. Furthermore, the injection molding of the connector housing eliminates the use of a sealing member to ensure airtightness between the cover and the connector. As a result, the size of the cover can be reduced.

Meanwhile, in the case of the above-described cover having the resin connector housing, the joining strength between the cover and the connector housing may not be sufficient and the connector housing may be detached from the cover easily, as compared with the cover that is joined to the inverter cover with bolts. In particular, the connector connected to the on-board electric equipment is subjected to vibration from other components on the vehicle and also vibration generated while the vehicle is traveling, which causes the connector housing to be detached from the cover easily. Therefore, with such cover, electric power may not be supplied suitably to the electric circuit through the connector.

The present disclosure has been made in view of the circumstances above, and is directed to providing a cover assembly for on-board electric equipment that enables reduction in the size thereof and that permits a connector to suitably supply electric power to an electric circuit, and a method of manufacturing the cover assembly.

SUMMARY

In accordance with an aspect of the present disclosure, there is provided a cover assembly for on-board electric equipment that is configured to accommodate an electric circuit. The cover assembly includes a cover body, and a connector that is mounted to the cover body, includes a terminal and a connector housing, and electrically connects the electric circuit to an external component outside the cover assembly. The cover body includes a ferrous base metal body, and a Zn-based plating layer formed on a surface of the base metal body that is away from the electric circuit. The cover body has a through hole that is formed through the base metal body and the plating layer. The terminal is passed through the through hole and connected to the electric circuit. The connector housing is formed on the cover body so as to surround the terminal. The connector housing is made of a thermoplastic resin-based material. A laser mark is formed on the cover body. The laser mark has a circular shape about the through hole and penetrates the plating layer to the base metal body. The connector housing extends to the base metal body through the plating layer within the laser mark.

In accordance with another aspect of the present disclosure, there is provided a method of manufacturing a cover assembly for on-board electric equipment that is configured to accommodate an electric circuit. The method includes preparing a base member, irradiating the base member with a laser beam, mounting a terminal, and forming a connector housing. In the preparing of a base member, the base member includes a ferrous base metal body, a Zn-based plating layer formed on a surface of the base metal body that is away from the electric circuit, and a through hole that is formed through the base metal body and the plating layer. In the irradiating of the base member with a laser beam, the base member is irradiated with a laser beam so that a circular laser mark is formed about the through hole. The laser mark is formed to penetrate the plating layer to the base metal body. In the mounting of a terminal, a terminal is mounted to the through hole to electrically connect the electric circuit to an external component outside the cover assembly. In the forming of a connector housing, a connector housing is formed such that the connector housing surrounds the terminal and that the connector housing extends to the base metal body through the plating layer within the laser mark. The connector housing is made of a thermoplastic resin-based material.

Other aspects and advantages of the disclosure will become apparent from the following description, taken in conjunction with the accompanying drawings, illustrating by way of example the principles of the disclosure.

BRIEF DESCRIPTION OF THE DRAWINGS

The disclosure, together with objects and advantages thereof, may best be understood by reference to the following description of the embodiments together with the accompanying drawings in which:

FIGS. 3A to 3C are enlarged fragmentary cross-sectional views of the electric compressor of the first embodiment, illustrating steps of manufacturing the inverter cover, wherein FIG. 3A is a cross-sectional view of a base member of the inverter cover; FIG. 3B is a cross-sectional view of the inverter cover mounted with a shield and a power supply assembly; and FIG. 3C is a cross-sectional view of the inverter cover on which a connector housing is formed;

DETAILED DESCRIPTION OF THE EMBODIMENTS

The following will describe electric compressors according to first to third embodiments of the present disclosure with reference to the accompanying drawings. The electric compressors of the embodiments are each mounted on a vehicle and forms part of a refrigeration circuit of an air-conditioning system of the vehicle. The electric compressors are examples of the on-board electric equipment of the present disclosure.

First Embodiment

Figure 1:
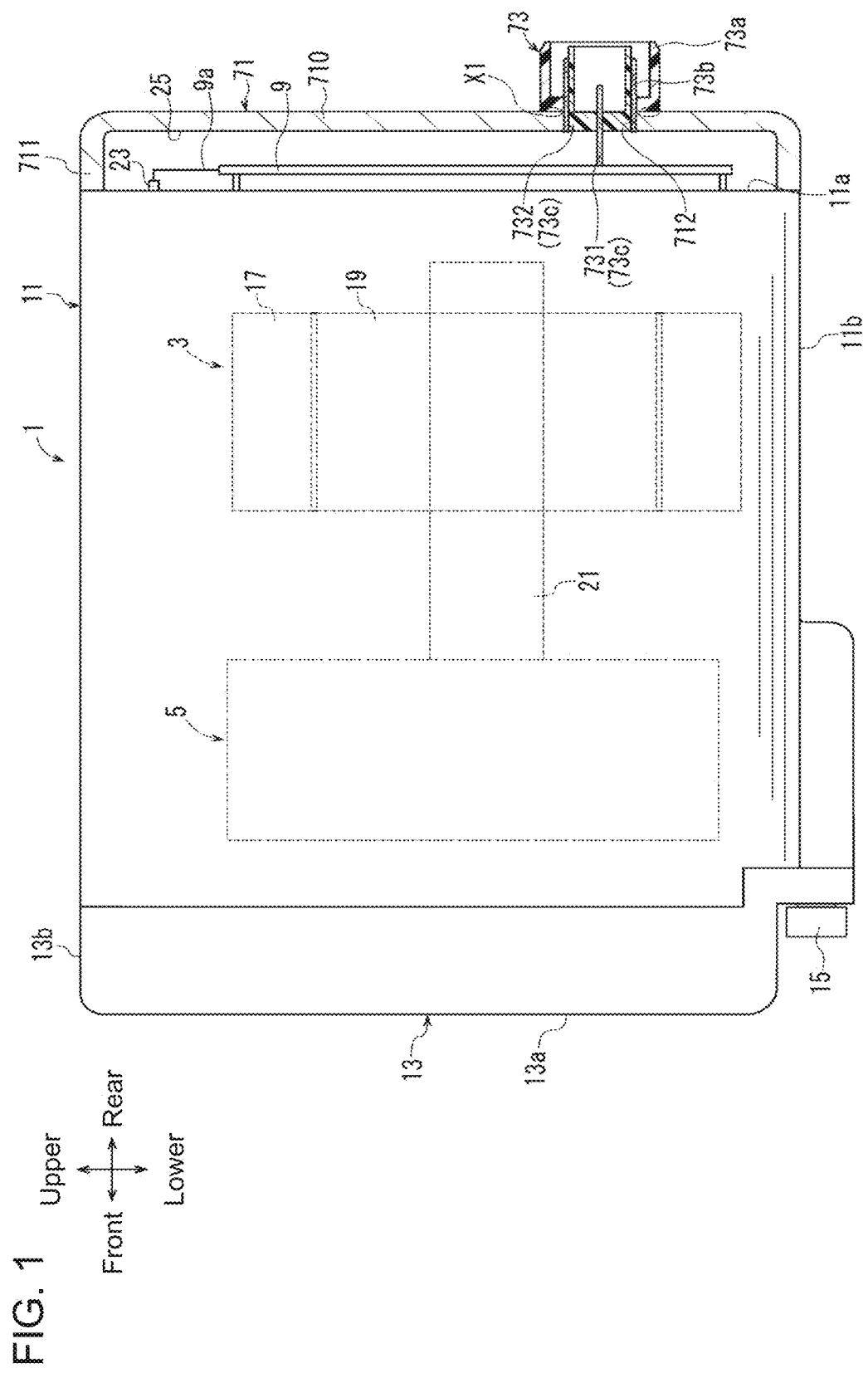
FIG. 1 is a longitudinal cross-sectional view of an electric compressor according to a first embodiment of the present disclosure.

As illustrated in FIG. 1, an electric compressor according to a first embodiment of the present disclosure includes a housing 1, an electric motor 3, a refrigerant compressor 5, an inverter cover 71 as the cover body of the present disclosure, and an inverter circuit 9. The inverter cover 71 and a connector 73 cooperate to form a cover assembly for on-board electric equipment of the present disclosure. The connector 73 will be described later in detail. The inverter circuit 9 is an example of the electric circuit of the present disclosure. The housing 1 includes a first housing member 11 and a second housing member 13.

In the first embodiment, as the longitudinal direction of the electric compressor, the side of the electric compressor where the second housing member 13 is disposed is referred to as the front side of the electric compressor, and the side of the electric compressor where the inverter cover 71 is disposed is referred to as the rear side of the electric compressor. As the vertical direction of the electric compressor, the upper and lower sides of the sheet of FIG. 1 are referred to as the upper and lower sides of the electric compressor, respectively. The definition of the longitudinal and vertical directions of the electric compressor of FIG. 1 applies to the remaining drawings of the present disclosure. It is to be noted that the installation posture of the electric compressor is changed appropriately according to the vehicle and the like in which the electric compressor is installed.

The first housing member 11 is made of an aluminum alloy. The first housing member 11 includes a first bottom wall 11a that extends in a radial direction of the electric compressor, and a first peripheral wall 11b that continues and extends forward from the first bottom wall 11a in an axial direction of the electric compressor. Thus, the first housing member 11 having the first bottom wall 11a and the first peripheral wall 11b has a substantially bottomed cylindrical shape that has an open front end. An intake port (not shown) is formed through the first peripheral wall 11b.

The second housing member 13 is also made of an aluminum alloy. The second housing member 13 includes a second bottom wall 13a that extends in the radial direction of the electric compressor, and a second peripheral wall 13b that continues and extends rearward from the second bottom wall 13a in the axial direction of the electric compressor. Thus, the second housing member 13 having the second bottom wall 13a and the second peripheral wall 13b has a substantially bottomed cylindrical shape that has an open rear end. An outlet port (not shown) is formed through the second bottom wall 13a.

The second housing member 13 is connected to a front end of the first housing member 11 with bolts 15, so that the first housing member 11 and the second housing member 13 are integrated. It is to be noted that the first and second housing members 11 and 13 may be formed of other material than aluminum alloy.

The electric motor 3 is accommodated in the first housing member 11. The electric motor 3 includes a stator 17, a rotor 19, a drive shaft 21, and a connecting portion (not shown). The stator 17 is fixed to an inner surface of the first peripheral wall 11b, and coils (not shown) are mounted on the stator 17. The rotor 19 is disposed radially inward of the stator 17. The drive shaft 21 is fixed to the rotor 19, so that the drive shaft 21 and the rotor 19 rotate integrally.

The refrigerant compressor 5 is located frontward of the electric motor 3 in the first housing member 11. A known scroll type refrigerant compressor is used for the refrigerant compressor 5 of the first embodiment. The refrigerant compressor 5 includes a fixed scroll that is fixed to the inner surface of the first peripheral wall 11b and a movable scroll that is disposed so as to face the fixed scroll. The movable scroll is mounted to the drive shaft 21 such that motive power is transmitted to the movable scroll through the drive shaft. Thus, the movable scroll is rotated by the rotation of the drive shaft 21. The fixed scroll and the movable scroll mesh with each other to form compression chambers there between. The fixed scroll and the second housing member 13 cooperate to form a discharge chamber therebetween. It is to be noted that the fixed scroll, the movable scroll, the compression chambers, and the discharge chamber are not illustrated in the drawings. It is also to be noted that a vane type refrigerant compressor may be used for the refrigerant compressor 5.

Figure 2:
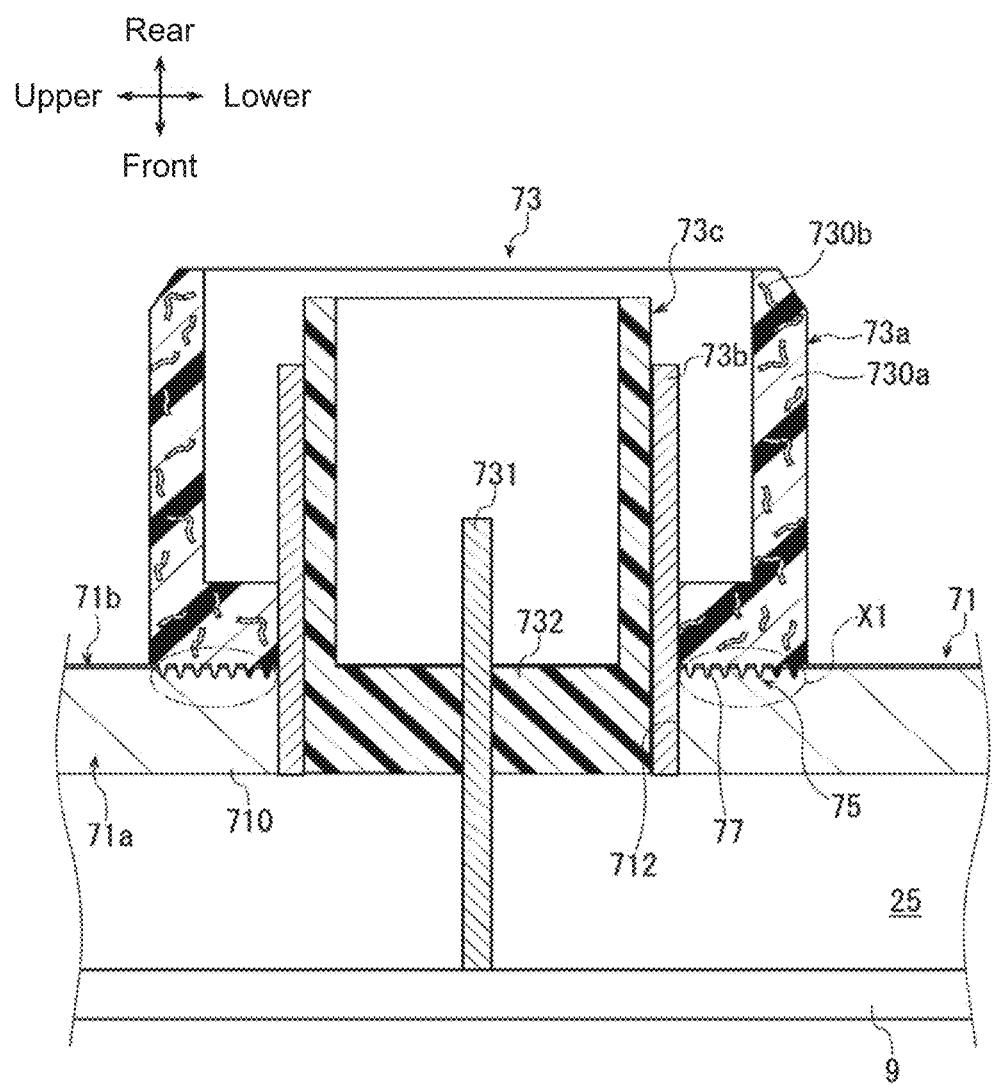
FIG. 2 is an enlarged fragmentary cross-sectional view of the electric compressor of the first embodiment, illustrating major parts of an inverter cover and a connector.

As illustrated in FIG. 2, the aforementioned connector 73 that includes a connector housing 73a is mounted to the inverter cover 71. The inverter cover 71 and the connector 73 or, more specifically, the inverter cover 71 and the connector housing 73a are integrated at a joining region X1. The connector housing 73a will be described later in detail.

The inverter cover 71 includes a ferrous base metal body 71a and a Zn-based plating layer 71b. Here, it is to be noted that, in the ferrous base metal body according to the present disclosure, Fe is the main component. Specifically, the base metal body 71a is made of steel. As illustrated in FIG. 1, the base metal body 71a includes a third bottom wall 710 that extends in the radial direction of the electric compressor, and a third peripheral wall 711 that continues and extends forward from the third bottom wall 710 in the axial direction of the electric compressor. The base metal body 71a, i.e., the inverter cover 71, having the third bottom wall 710 and the third peripheral wall 711 has a substantially bottomed cylindrical shape that has an open front end. The third bottom wall 710 has a through hole 712 that is formed through the base metal body 71a and the plating layer 71b. The inverter cover 71 is connected to a rear end of the first housing member 11 with bolts (not shown), so that an accommodating chamber 25 is formed between the first bottom wall 11a and the inverter cover 71.

Figure 5:
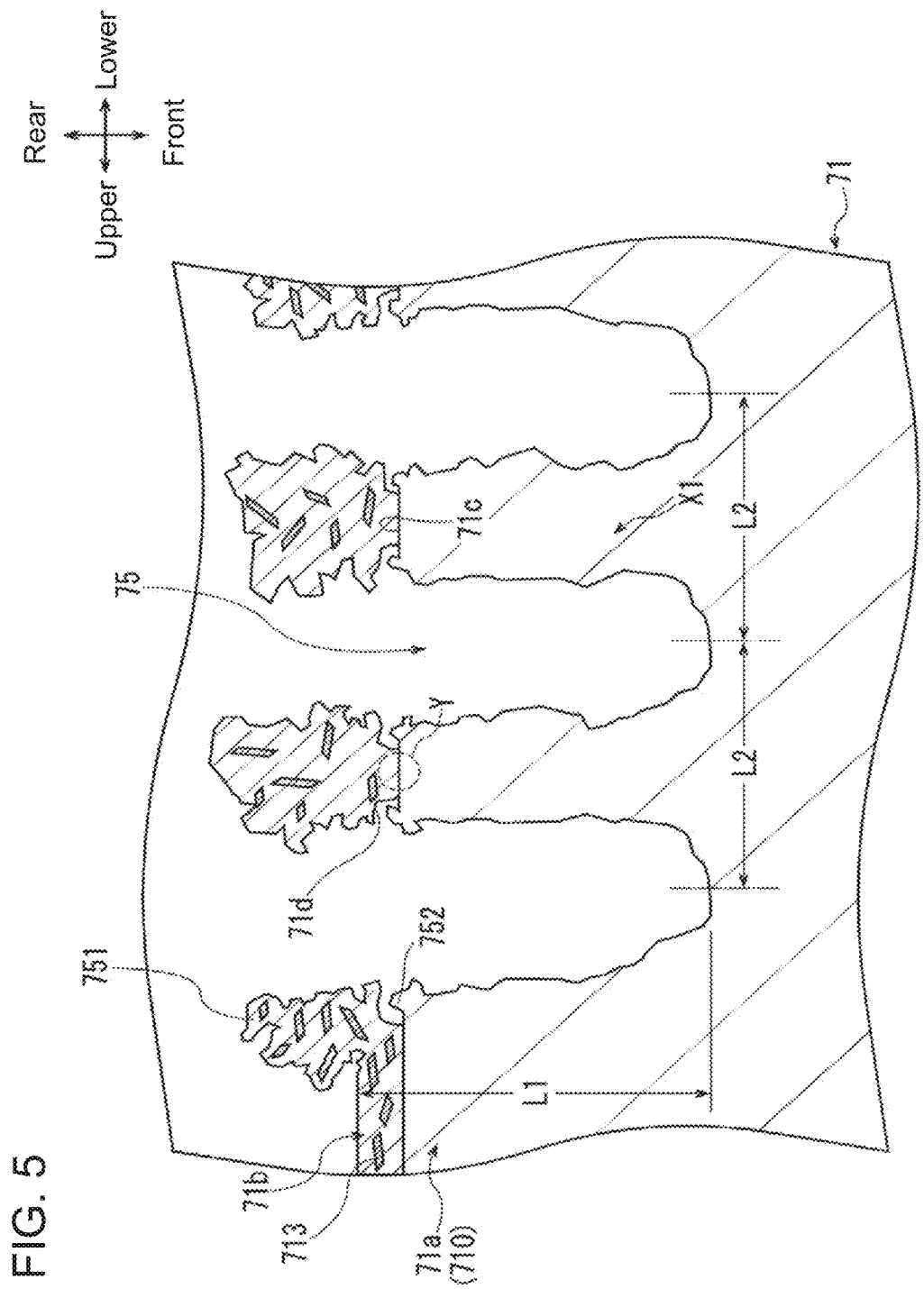
FIG. 5 is an enlarged fragmentary cross-sectional view of the electric compressor of the first embodiment taken along line V-V of FIG. 4.
Figure 7:
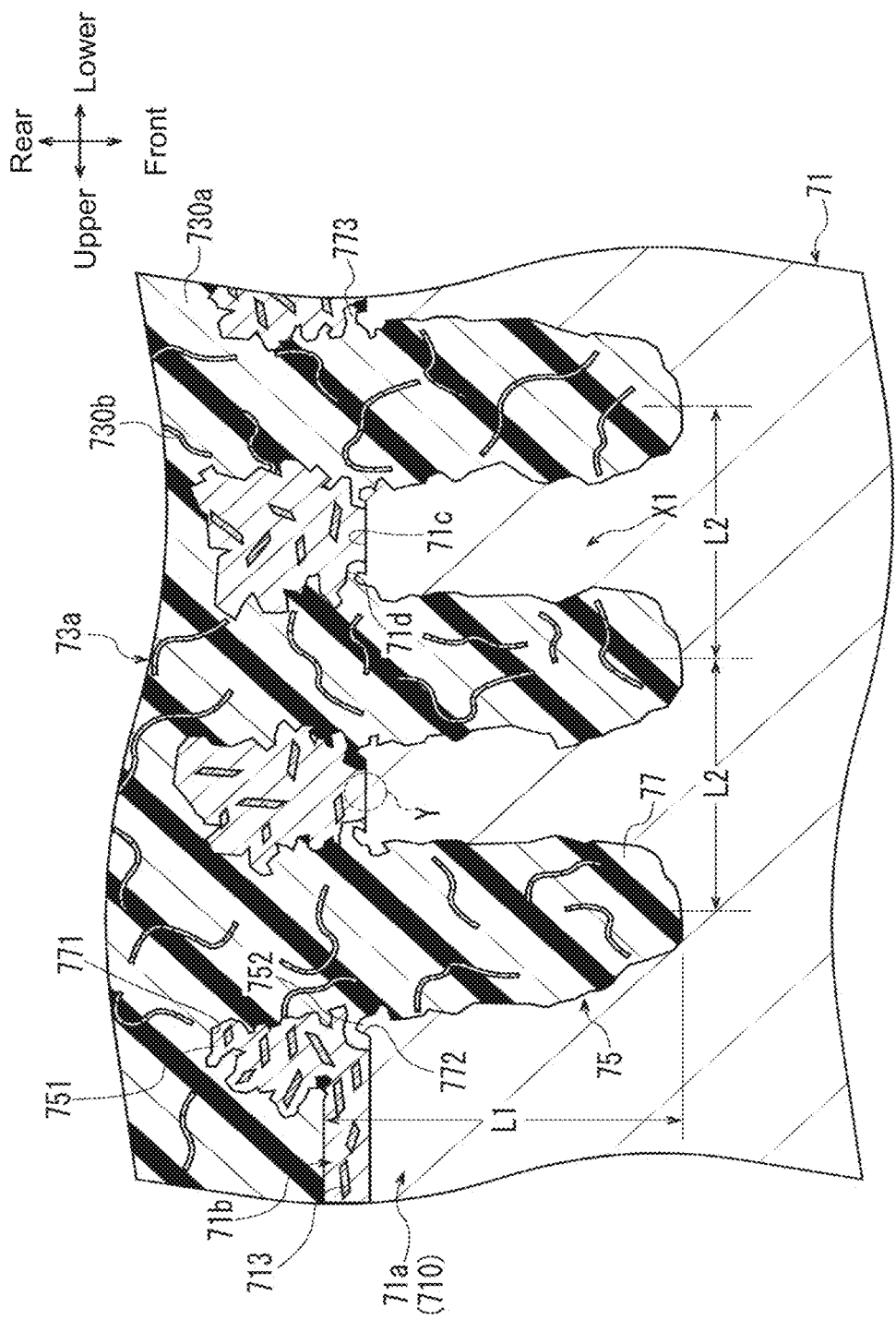
FIG. 7 is an enlarged fragmentary cross-sectional view of the inverter cover of the electric compressor of the first embodiment on which the connector housing is formed, as viewed in the same direction as FIG. 5.

As illustrated in FIG. 2, the plating layer 71b is formed on an external surface of the base metal body 71a that is away from the inverter circuit 9. It is to be noted that, in the Zn-based plating layer according to the present disclosure, Zn is the main component and preferably contains Al. Specifically, the plating layer 71b is composed of Zn, Mg, and Al. According to the findings of the inventors, the melting point of Al is higher than the melting point of Zn, so that Zn, Mg, and Al are not mixed homogeneously in the plating layer 71b, as shown in FIGS. 5 and 7. Thus, aluminum flakes 713, which are aluminum in a flake form, are present in the plating layer 71b. It is to be noted that in FIGS. 5 and 7, the illustration of the profiles of the plating layer 71b and the shape of the aluminum flakes 713 or the like is exaggerated for easy understanding, and the same applies to FIGS. 11 to 14. It is also to be noted that the plating layer 71b is not illustrated in FIG. 1.

As illustrated in FIG. 2, the connector 73 includes connector housing 73a made of a thermoplastic resin-based material, a shield 73b, and a power supply assembly 73c. The connector housing 73a is formed by a base material 730a that contains glass fibers 730b. It is to be noted that, in the thermoplastic resin-based connector housing according to the present disclosure, a thermoplastic resin is the main component. Specifically, the base material 730a is made of polyphenylene sulfide, which is a thermoplastic resin. The glass fibers 730b are examples of the reinforcing fiber of the present disclosure that is made of a material having a strength higher than that of the thermoplastic resin. It is to be noted that the base material 730a may be made of other thermoplastic resin than polyphenylene sulfide. In FIG. 2 and similar drawings, the illustration of the glass fibers 730b is exaggerated for easy understanding.

The shield 73b is made of a metal and has a cylindrical shape. The shield 73b is fitted over the power supply assembly 73c. The power supply assembly 73c includes a metallic terminal 731 and an insulating resin 732. The power supply assembly 73c is formed by insert molding.

The joining region X1 is provided radially outward of the through hole 712. A plurality of laser marks 75 is formed or engraved within the joining region X1. The laser marks 75 are formed in a circular shape about the through hole 712. The laser marks 75 are concentric with the through hole 712 and surround the through hole 712. The laser marks 75 are located radially outward of the through hole 712.

The following will describe in detail a method of manufacturing the inverter cover 71 with reference to FIGS. 3A to 3C. First, as a preparation step, a base member 700 of the inverter cover 71 is prepared, as illustrated in FIG. 3A. The base member 700 includes the aforementioned base metal body 71a and plating layer 71b formed on the base metal body 71a. The base member 700 also has the aforementioned through hole 712. A base member having a through hole, like the base member 700, may be prepared by, for example, punching a plated steel plate.

Figure 4:
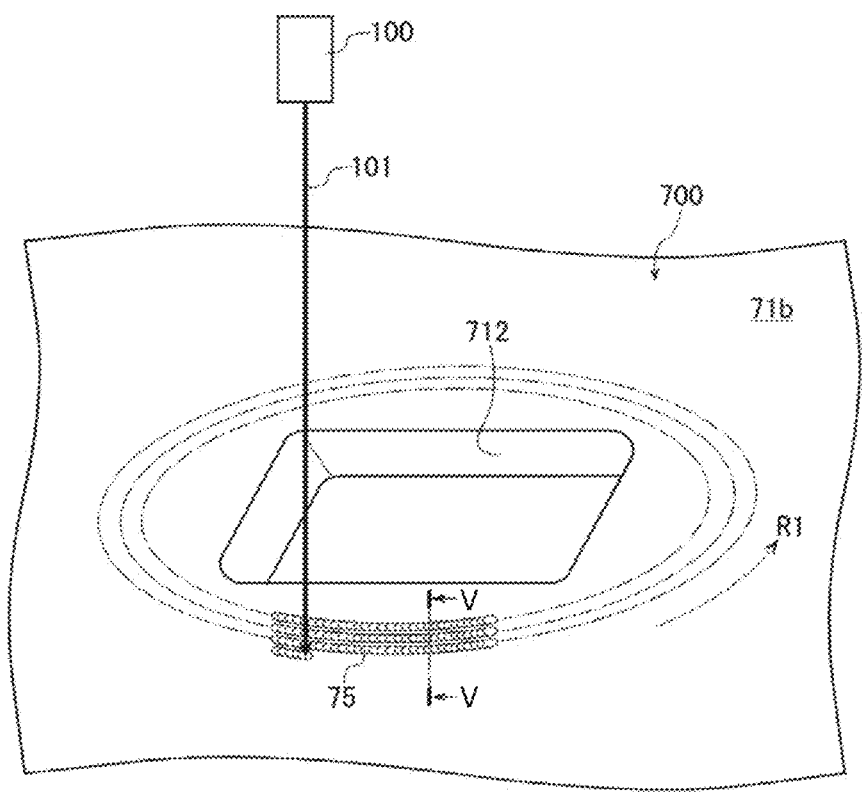
FIG. 4 is a schematic view of the electric compressor of the first embodiment, illustrating the steps of forming laser marks by irradiation of a laser beam.

Subsequently, the base member 700 is radiated with a laser beam. By emitting a laser beam 101 to the base member 700, the laser marks 75 are formed on the base member 700, so that the inverter cover 71 that is shown, for example, in FIG. 3B and FIG. 5 is obtained. A commercially-available laser irradiation device 100 shown in FIG. 4 is used for the laser beam irradiation. The laser irradiation device 100 irradiates a surface of the base member 700 having the plating layer 71b with the laser beam 101, while being moved in an R1 direction to circle around the through hole 712. Then, part of the base member 700 irradiated with the laser beam 101 is melted. During the laser beam irradiation, the output of the laser irradiation device 100 may be adjusted so that the laser beam 101 passes through the plating layer 71b to reach the base metal body 71a, and the circling motion of the laser irradiation device 100 in the R1 direction is repeated a desired number of times. The part of the base member 700 that has been melted by the irradiation of the laser beam 101 hardens with time, and forms a first laser mark 75 in a circular shape around the through hole 712. As illustrated in FIG. 5, the laser mark 75 has a depth L1 and penetrates the plating layer 71b to the base metal body 71a, Subsequently, the laser irradiation device 100 is moved by a first distance L2 in the width direction of the laser mark 75 so that a second laser mark 75 to be formed after the first laser mark 75 has been formed is not laid over the first laser mark 75. Here, the first distance L2 is smaller than the depth L1 of the laser mark 75. The second laser mark 75 is formed in the same manner as the first laser mark 75 that has previously been formed. That is, the laser irradiation device 100 irradiates the base member 700 with the laser beam 101 while being moved in the R1 direction, as illustrated in FIG. 4. As a result, the second laser mark 75 is formed radially outward of the first laser mark 75. The first and second laser marks 75 are concentric with the through hole 712. The laser irradiation is repeated as necessary so that a desired base member 700 having a plurality of laser marks 75 that are concentric with each other and also concentric with the through hole 712 is obtained. In other words, the laser marks 75 are located radially outward of the through hole 712 and formed in a circular shape about the through hole 712. When a desired inverter cover 71 is obtained from the base member 700, the laser beam irradiation is terminated. It is to be noted that "the laser marks 75 are concentric with the through hole 712" herein refers to the condition that the centers of the laser marks 75 coincide with the center of the through hole 712. It is also to be noted that the number of laser marks 75 to be formed may be determined appropriately.

The laser beam 101 that creates the laser marks 75 has a high temperature. The heat of the laser beam 101 is reflected by the laser marks 75, and the reflected heat then heats part of the base metal body 71a near the laser marks 75 to a high temperature. The heat of the base metal body 71a is transmitted to an interface 71c between the base metal body 71a and the plating layer 71b, so that part of the plating layer 71b that is in contact with the interface 71c is melted. As a result, grooves 71d are formed on the interface 71c such that the grooves 71d are open to the laser marks 75. The grooves 71d are integrated with their adjacent laser marks 75. In this way, the grooves 71d formed by the melted plating layer 71b has intricate profiles.

The plating layer 71b contains aluminum flakes 713. The melting point of Al is higher than the melting point of Zn. Therefore, when the plating layer 71b is melted by the irradiation of the laser beam 101, the aluminum flakes 713 cause irregularities in the plating layer 71b. As a result, the laser marks 75 have intricate profiles at the parts thereof adjoining the plating layer 71b. Furthermore, in the laser marks 75, the plating layer 71b and the base metal body 71a have first projections 751 and second projections 752, respectively, that are burrs formed during the irradiation of the laser beam 101. The second projections 752 are part of the base metal body 71a that is turned up in such a manner as to block the openings of the grooves 71d by the irradiation of the laser beam 101. Thus, the first projections 751 that project from the plating layer 71b in a direction away from the base metal body 71a, and the second projections 752 that project from the base metal body 71a, and the plurality of grooves 71d are present in the joining region X1. In the case of the second projections 752, the formed second projections 752 may project into the grooves 71d. In such case, the profiles of the grooves 71d become more intricate by the second projections 752.

Two neighboring laser marks 75 are separated from each other in the width direction of the laser marks 75 by the first distance L2. Therefore, a region, denoted as Y, where the plating layer 71b and the base metal body 71a are joined is present between any two neighboring laser marks 75. Thus, the plating layer 71b is not melted completely at parts of the interface 71c located between the neighboring laser marks 75.

Subsequently, a terminal is mounted to the through hole 712. In this step, the shield 73b and the power supply assembly 73c are fitted into the through hole 712, as illustrated in FIG. 3B. Thus, the shield 73b and the power supply assembly 73c are fixed to the inverter cover 71. It is to be noted that the shield 73b and the power supply assembly 73c are the terminal of the present disclosure.

Figure 6:
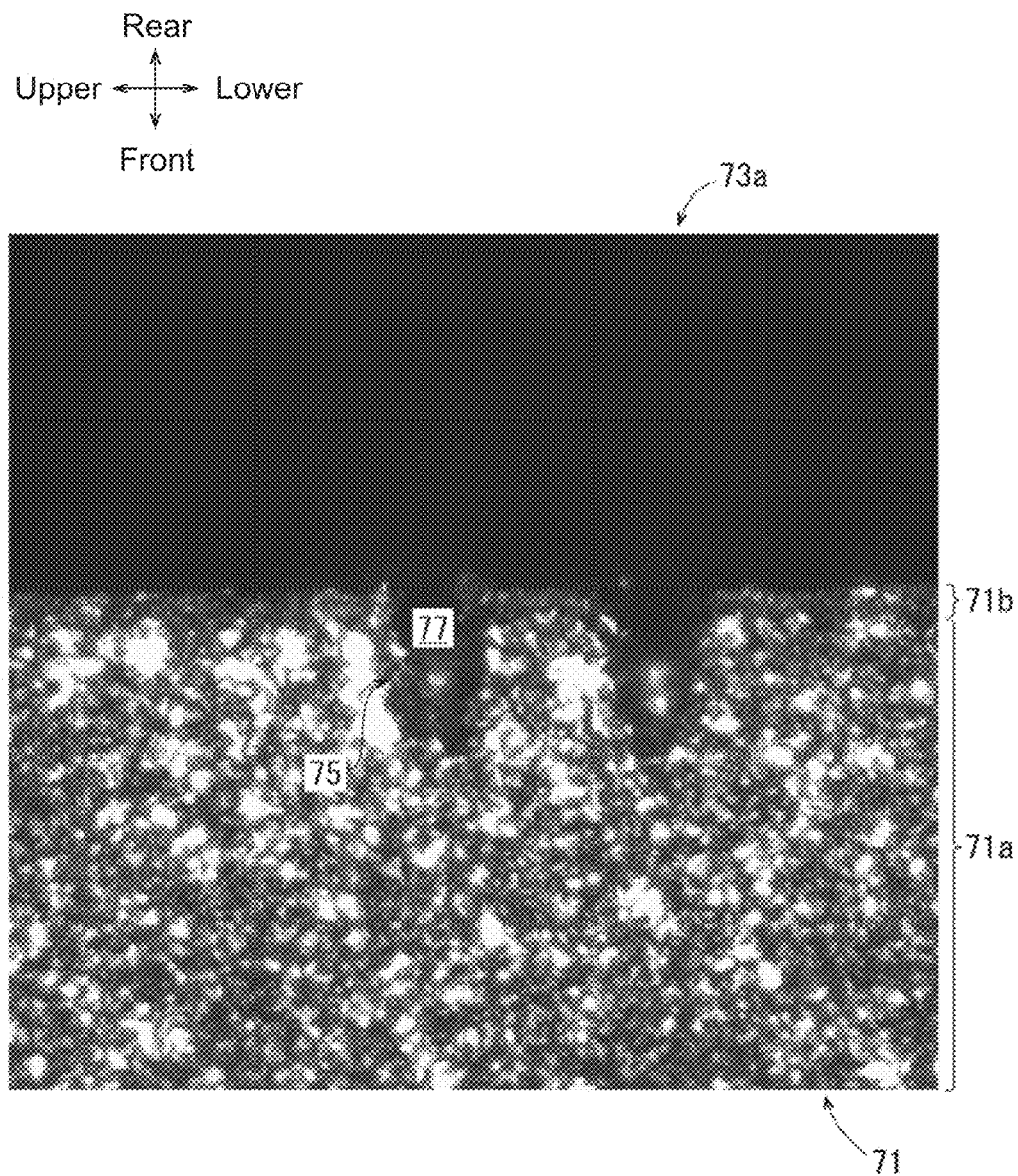
FIG. 6 is a photograph of a magnified cross-section of the inverter cover of the electric compressor of the first embodiment on which the connector housing is formed.

Subsequently, a connector housing is formed. In this step, a molding die 79 is prepared and attached to the inverter cover 71, as illustrated in FIG. 3C, so that a cavity C1 is formed by the inverter cover, 71, the shield 73b, the power supply assembly 73c, and an inner surface of the molding die 79. A base material 730a that contains the glass fibers 730b is injected into the cavity C1 to form the connector housing 73a. During the injection molding, the base material 730a containing the glass fibers 730b flows into the laser marks 75. As shown in FIG. 6, the base material 730a that has flowed into the laser marks 75 are molded into engagement portions 77, which are integral parts of the connector housing 73a. Since the laser marks 75 are formed in a circular shape about the through hole 712, the engagement portions 77 are also formed in a circular shape about the through hole 712, conforming to the circular laser marks 75. With the engagement portions 77 that are shaped by the laser marks 75, the connector housing 73a extends or penetrates the plating layer 71b to the base metal body 71a within the laser marks 75. As illustrated in FIG. 7, in the joining region X1, the engagement portions 77 have first recesses 771, second recesses 772, and third projections 773. Each first recess 771 conforms to its corresponding first projection 751; each second recess 772 conforms to its corresponding second projection 752; and each third projection 773 is formed in each engagement portion 77 so as to enter each groove 71d.

After the base material 730a is hardened in the cavity C1, in the joining region X1, the first projections 751 and the first recesses 771 are engaged, and the second projections 752 and the second recesses 772 are engaged. The third projections 773 and the grooves 71d are engaged. In this way, the engagement portions 77 engage with the laser marks 75. By the engagement of the engagement portions 77 and the laser marks 75, the inverter cover 71 and the connector housing 73a are firmly joined and integrated at the joining region X1. Then, the molding die 79 (FIG. 3C) is removed from the inverter cover 71 and the connector housing forming step is terminated, and the inverter cover 71 that surrounds the terminal 731 is completed.

Referring to FIG. 1, the inverter circuit 9 is accommodated in the accommodating chamber 25. The inverter circuit 9 is electrically connected with the terminal 731 of the power supply assembly 73c. The inverter circuit 9 is also connected with a connection terminal 23 via a lead wire 9a. The connection terminal 23 is connected to a connecting portion of the electric motor 3 (not shown). Thus, the inverter circuit 9 is electrically connected with the electric motor 3.

In the configuration of the electric compressor described above, the connector 73 of the inverter cover 71 is connected to an external power source (not shown) that is provided outside the inverter cover 71 via a cable (not shown). The inverter circuit 9 is supplied with DC power from the external power source. The inverter circuit 9 converts the received DC power into AC power and supplies the AC power to the electric motor 3 to thereby control the driving of the electric motor 3. The electric motor 3 supplied with AC power rotates the rotor 19 and the drive shaft 21, which drives the refrigerant compressor 5. In the refrigerant compressor 5, refrigerant gas that is taken in through the intake port is compressed, and the compressed refrigerant gas is discharged through the outlet port.

As illustrated in FIG. 2, in the electric compressor according to the first embodiment, by the engagement of the laser marks 75 and the engagement portions 77, the inverter cover 71 and the connector housing 73a are firmly joined and integrated at the joining region X1. As described above, the inverter cover 71 and the connector housing 73a are not integrated by bolts but joined and integrated by engagement. Therefore, no threaded holes are provided at the joining region X1. Rather, the joining region X1 does not require any space for bolts. Moreover, the inverter cover 71 does not require any sealing member to ensure the air tightness between the inverter cover 71 and the connector 73. Therefore, the inverter cover 71 can have a smaller joining region X1, which then permits reduction in size of the inverter cover 71 as a whole.

The inverter cover 71 also includes the base metal body 71a and the plating layer 71b, as illustrated in FIG. 7. Laser marks 75 penetrate the plating layer 71b to the base metal body 71a, while being integrated with the grooves 71d. Thus, in the inverter cover 71, each engagement portion 77 of the connector housing 73a enters the grooves 71d as well as the laser mark 75 at the joining region X1.

Here, each laser mark 75 has the depth L1, which is sufficient for engagement. Therefore, in the joining region X1 of the inverter cover 71, the engagement portions 77 enter the laser marks 75 of a sufficient depth, and the first and second projections 751 and 752 engage with the first and second recesses 771 and 772, respectively. The third projections 773 engage with the grooves 71d.

The plating layer 71b is composed of Zn, Mg, and Al. Therefore, the plating layer 71b has intricate profiles caused by the aluminum flakes 713 at the parts thereof adjoining the laser marks 75. Similarly, the grooves 71d that are formed in the interface 71c so as to face the laser marks 75 have intricate profiles. Therefore, in the laser marks 75, the engagement portions 77 are meshed and engaged with the plating layer 71b and the grooves 71d having intricate profiles. At the joining region X1, the inverter cover 71 and the connector housing 73a, i.e., the inverter cover 71 and the connector 73 are integrated firmly. The effects of the integration will now be described, with a comparison with a comparative embodiment.

Although not illustrated in the drawings, an electric compressor according to the comparative embodiment has the same structure as that of the electric compressor according to the first embodiment of the present disclosure, except that the inverter cover 71 of the comparative embodiment is coated with a plating layer 71b composed solely of Zn. In the electric compressor of the comparative embodiment, the plating layer 71b is composed of Zn only. Therefore, the homogeneous plating layer 71b and the grooves 71d in the laser marks 75 do not have intricate profiles, as compared with the electric compressor of the first embodiment. Therefore, in the electric compressor of the comparative embodiment, the profiles of the plating layer 71b and the grooves 71d that are less intricate do not provide firm and reliable engagement of the inverter cover 71 and the connector housing 73a, as compared with the electric compressor of the first embodiment.

Figure 8:
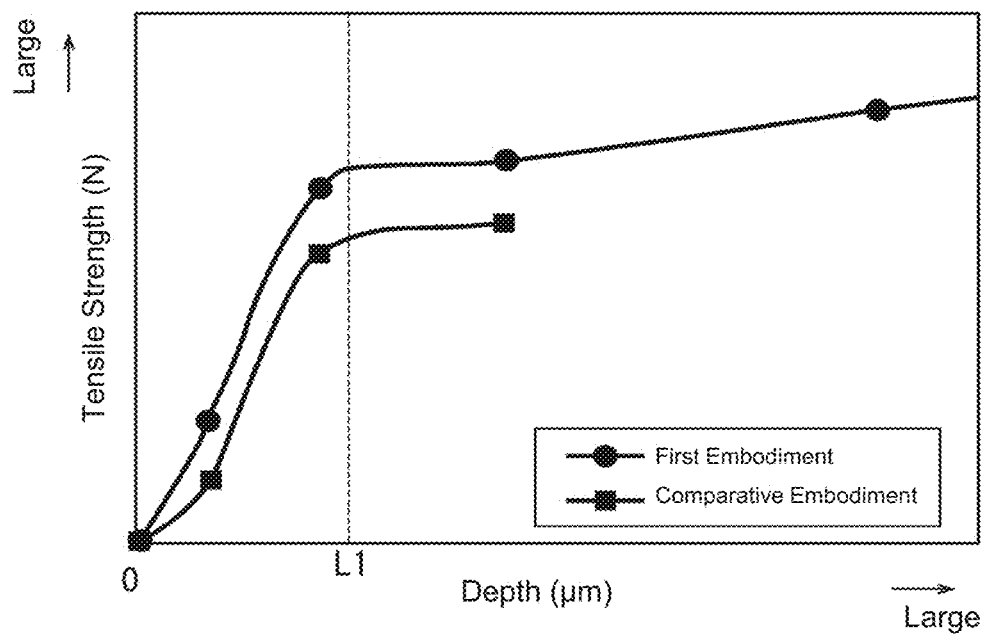
FIG. 8 is a graph showing a relationship between the depth of the laser mark and the tensile strength of the connector of the electric compressor of the first embodiment.

Referring to the graph of FIG. 8 comparing the tensile strength of the connector 73 between the electric compressor of the first embodiment and the electric compressor of the comparative embodiment, when the depth of the laser marks 75 is L1, the tensile strength of the connector 73 of the first embodiment is higher than that of the comparative embodiment. Thus, in the inverter cover 71 of the first embodiment, the connector housing 73a, and hence the connector 73, is hardly detached under the vibration environment due to other equipment on the vehicle and the traveling of the vehicle.

Therefore, the inverter cover 71 of the first embodiment of the present disclosure can be made smaller while permitting the connector 73 to suitably supply electric power to the inverter circuit 9. Furthermore, according to the method of manufacturing the inverter cover 71 for on-board electric equipment of the present disclosure, the inverter cover 71 may be made smaller while permitting the connector 73 to suitably supply electric power to the inverter circuit 9.

In particular, since the plurality of laser marks 75 are formed on the inverter cover 71, the engagement of the laser marks 75 and the engagement portions 77 take place at plurality of sites, so that the integration of the inverter cover 71 and the connector 73 is further enhanced, as compared with an inverter cover having only a single laser mark 75 engaging with a single engagement portion 77 at a single site.

As illustrated in FIGS. 5 and 7, neighboring laser marks 75 are separated from each other by the first distance L2 in the width direction thereof. The first distance L2 is smaller than the depth L1 of the laser marks 75. Therefore, in the inverter cover 71, the distance or interval between neighboring laser marks 75 is small. This means that the distance or interval between neighboring engagement portions 77 is also small. Therefore, at the joining region X1, the engagements of the engagement portions 77 and the laser marks 75 take place at small intervals. With this structure, the connector housing 73a is hardly detached from the inverter cover 71. Furthermore, the distance between neighboring engagements of the engagement portions 77 and the laser marks 75 is small, so that the air tightness between the inverter cover 71 and the connector 73 is sufficiently enhanced.

In the structure in which the neighboring laser marks 75 are separated from each other by the first distance L2 in the width direction thereof, even though the distance between neighboring laser marks 75 is small, regions Y at which the plating layer 71b and the base metal body 71a are joined are provided between the neighboring laser marks 75. In other words, the neighboring laser marks 75 are separated from each other, leaving an incompletely melted plating layer 71b at the interface 71c therebetween. With this structure, the grooves 71d may suitably be formed on the interface 71c, and the neighboring laser marks 75 are integrated with the grooves 71d of the interface 71c. In this regard also, the integration of the inverter cover 71 and the connector 73 is further enhanced.

Furthermore, since the connector housing 73a contains the glass fibers 730b, the glass fibers 730b in the engagement portions 77 also engage with the laser marks 75. The molecular size of polyphenylene sulfide as the base material 730a is relatively small. Therefore, the base material 730a suitably flows into the laser marks 75 and the grooves 71d to form the engagement portions 77. In this regard also, the integration of the inverter cover 71 and the connector 73 is further enhanced. Moreover, the strength of the connector housing 73a is improved by the glass fibers 730b. As a result, the connector housing 73a is not damaged easily even after a cable or the like (not shown) is repeatedly connected to and disconnected from the connector 73.

The laser marks 75 are formed in such a manner as to surround the through hole 712. Therefore, the laser marks 75 and the engagement portions 77 conforming to the laser marks 75 are formed so as to surround the terminal 731. In this state, when the connector 73 is connected with a power source, a large load is applied around the terminal 731 in a direction in which the connector 73 is detached from the inverter cover 71. In the inverter cover 71, the laser marks 75 and the engagement portions 77 engage with each other at positions close to the terminal 731, which prevents the connector housing 73a from being detached easily from the inverter cover 71.

The plating layer 71b is composed of Zn, Mg, and Al, Therefore, it is possible to approximate the coefficient of thermal expansion of the base metal body 71a to that of the plating layer 71b. The temperature of the base metal body 71a rises and falls depending on the irradiation of the laser beam 101. However, because the plating layer 71b on the base metal body 71a buffers the heat of the laser beam 101, abrupt change in the temperature of the base metal body 71a is prevented. With this structure, the laser marks 75 are suitably formed during the laser beam irradiation step.

Since the size of the joining region X1 of the inverter cover 71 is reduced, it is possible to reduce the duration of time of the laser beam irradiation for forming the laser marks 75. Furthermore, the joining region X1 of a reduced size enables reduction of the size of the connector housing 73a. Consequently, reduction of the manufacturing cost of the inverter cover 71 is achieved.

Second Embodiment

Figure 9:
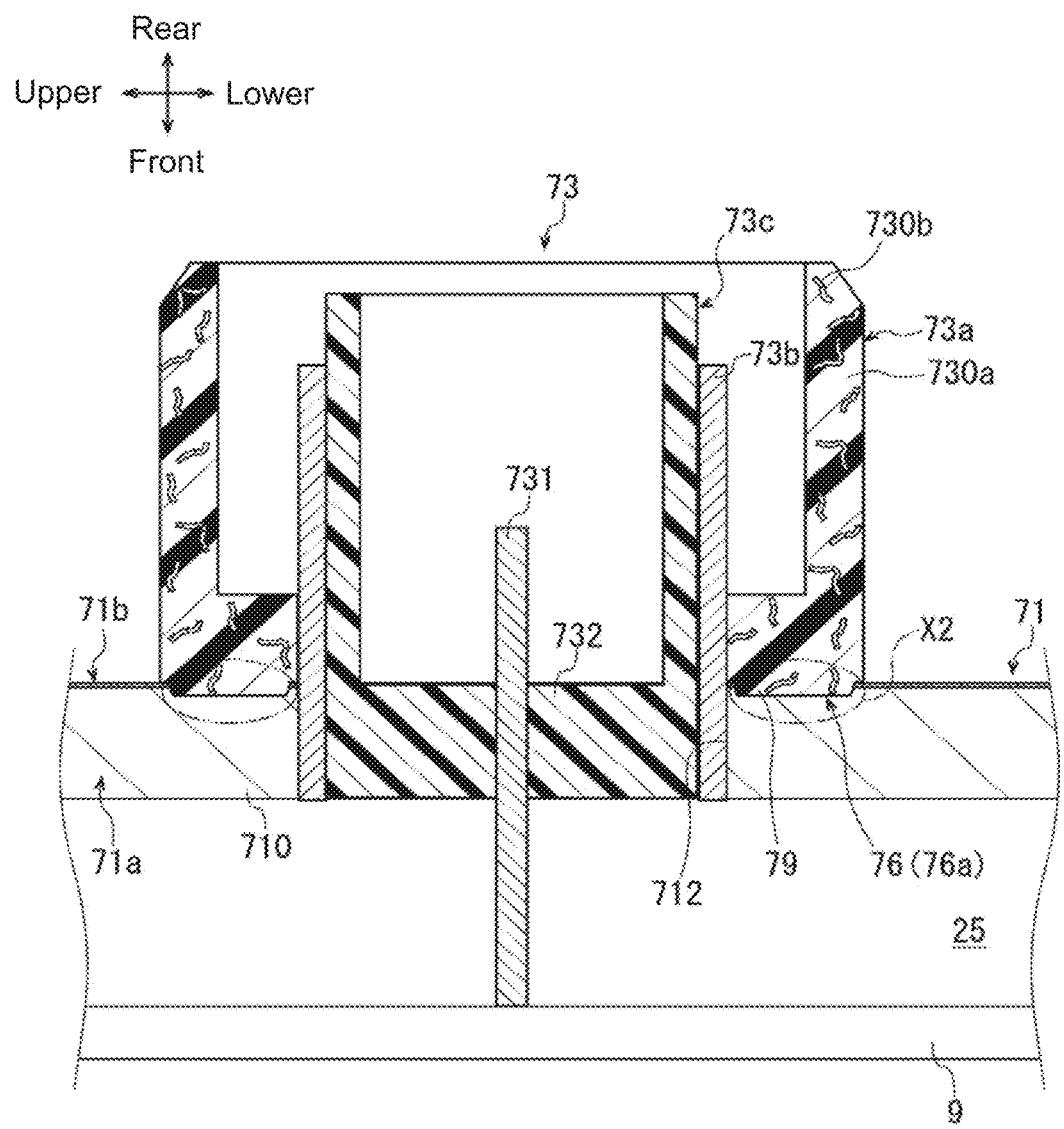
FIG. 9 is an enlarged cross-sectional view of an electric compressor according to a second embodiment of the present disclosure, illustrating a major part of a connector.

As illustrated in FIG. 9, in an electric compressor according to a second embodiment of the present disclosure, an inverter cover 71 and a connector housing 73a are joined and integrated at a joining region X2. A laser mark 76 is engraved or formed within the joining region X2. The laser mark 76 includes a plurality of first laser marks 76a that are concentric with each other and also concentric with a through hole 712.

Figure 10:
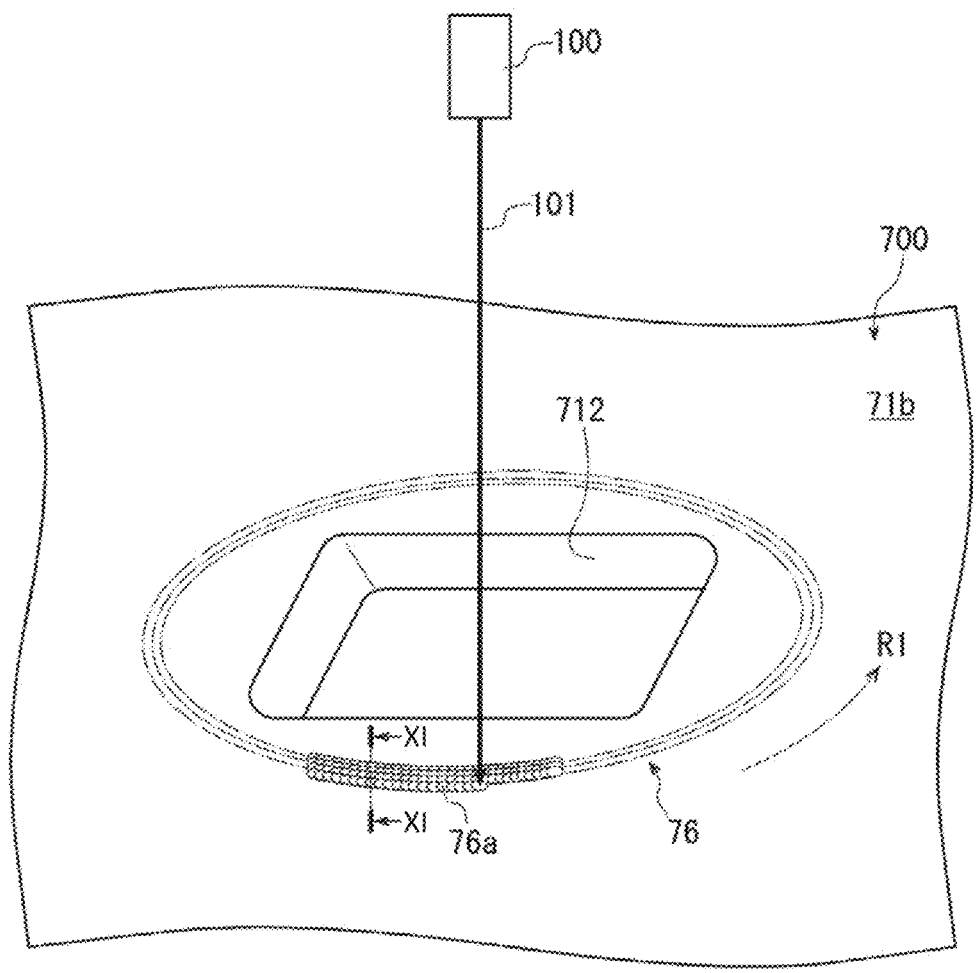
FIG. 10 is a schematic view of the electric compressor of the second embodiment, illustrating the steps of forming a laser mark by irradiation of a laser beam.
Figure 11:
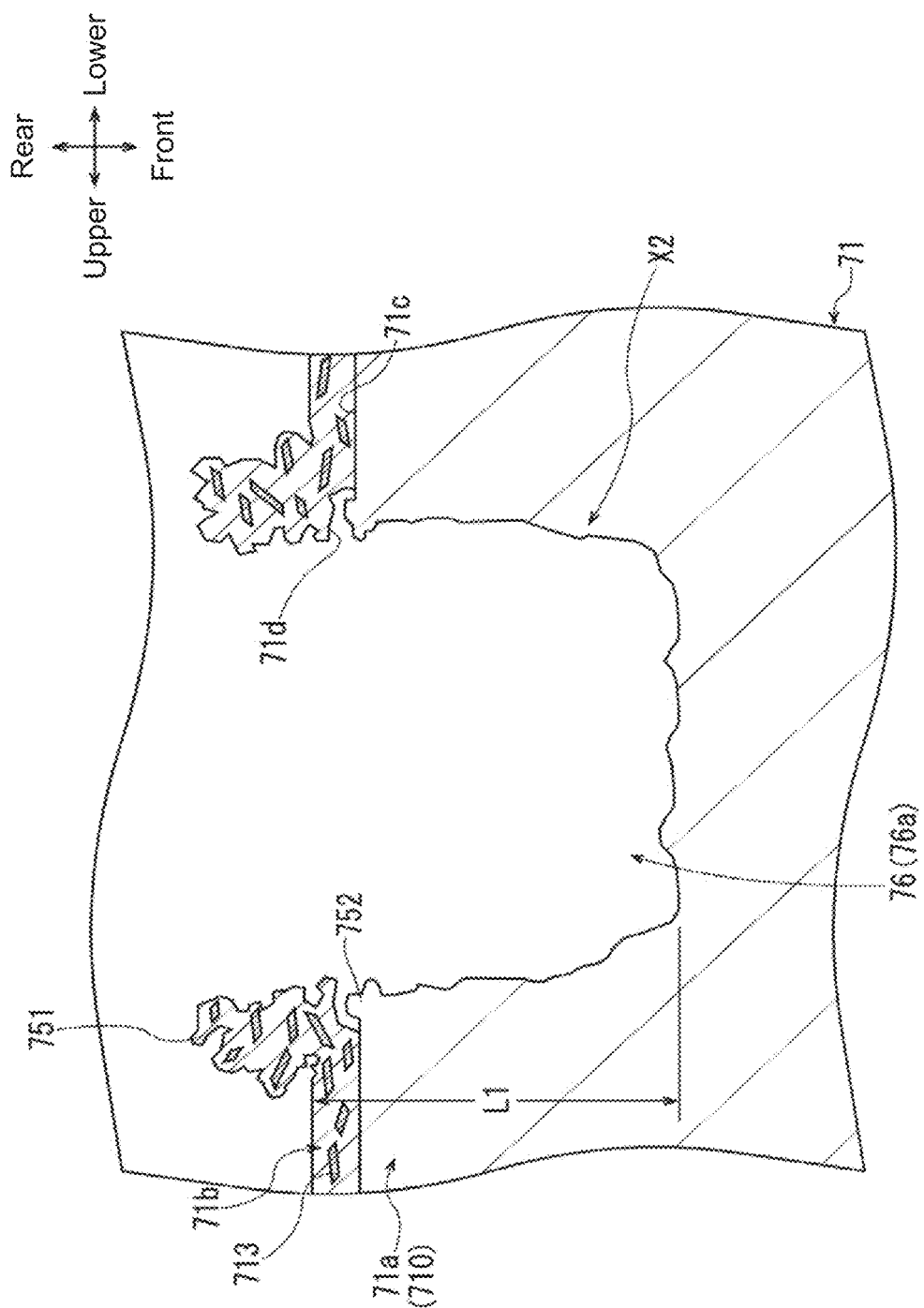
FIG. 11 is an enlarged fragmentary cross-sectional view of the electric compressor of the second embodiment taken along line XI-XI of FIG. 10.

According to the second embodiment, a base member 700 shown in FIG. 3A is prepared in the base member preparing step, as is the case of the electric compressor of the first embodiment. In the subsequent laser beam irradiation step, one first laser mark 76a is initially formed radially outward of the through hole 712 in the same manner as the first embodiment, as illustrated in FIG. 10. That is, the first laser mark 76a and the laser mark 76 have a depth L1, as illustrated in FIG. 11. Subsequently, a laser irradiation device 100 is moved in the width direction of the first laser mark 76a so that another first laser mark 76a that is to be subsequently formed partially overlaps the initially formed first laser mark 76a and extends along the initially formed first laser mark 76a. Then, the laser irradiation device 100 irradiates the base member 700 with a laser beam 101, while being moved in an R1 direction. With this operation, the subsequently-formed first laser mark 76a is formed to extend along and partially overlap the first laser mark 76a that has been formed immediately before. Creation of the first laser marks 76a is repeated until a laser mark 76 of a desired width is obtained.

Referring to FIG. 11, the width of the groove of the laser mark 76 is greater than the groove widths of the laser marks 75 of the first embodiment shown in FIG. 5. It is to be noted that the groove width of the laser mark 76 may be appropriately modified by changing the number of the first laser marks 76a formed.

Figure 12:
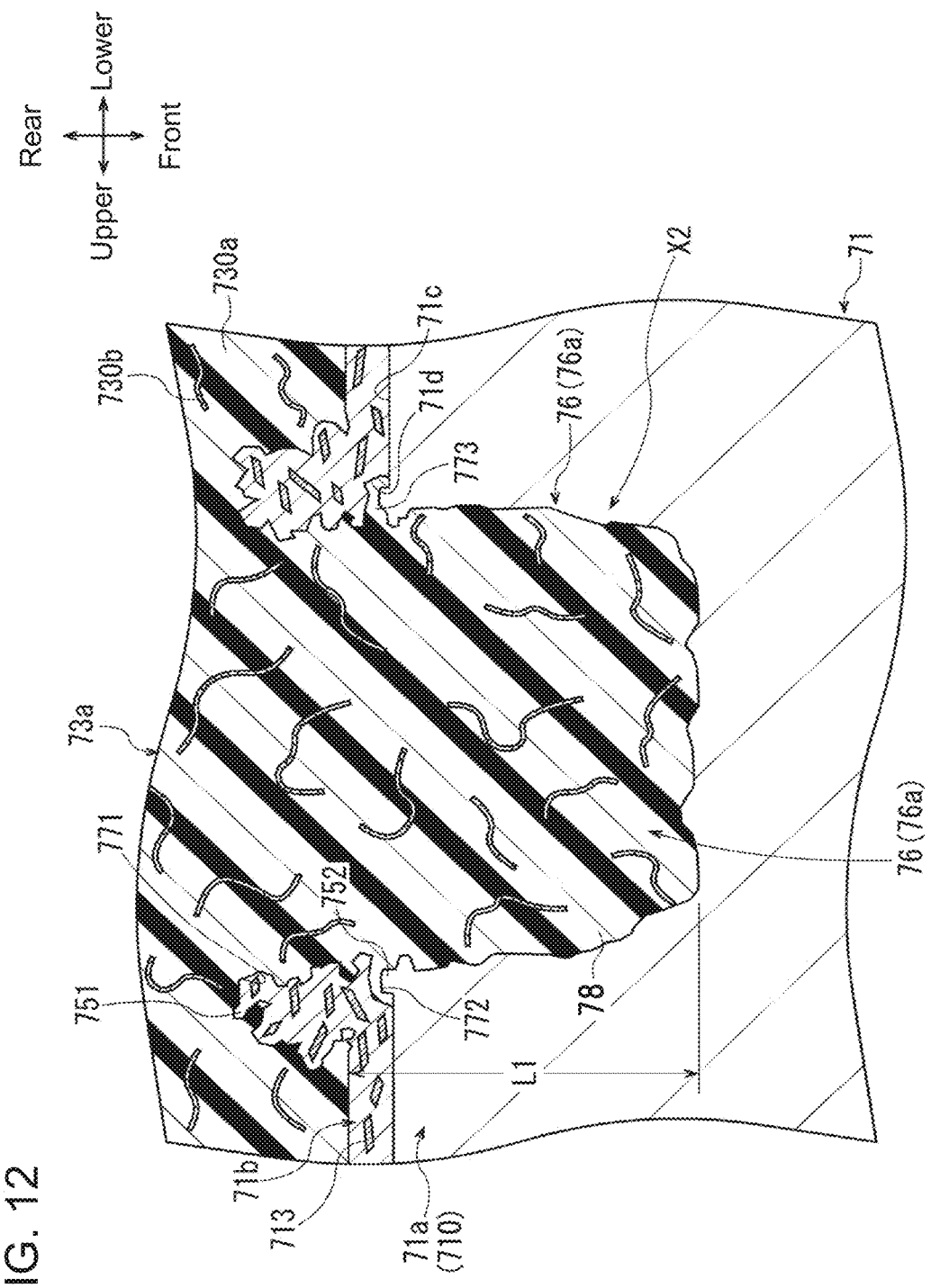
FIG. 12 is an enlarged fragmentary cross-sectional view of an inverter cover of the electric compressor of the second embodiment on which a connector housing is formed, as viewed in the same direction as FIG. 11.

In the connector housing forming step according to the second embodiment in which the connector housing 73a of the electric compressor is formed, a base material 730a that contains glass fibers 730b flows into the laser mark 76, as illustrated in FIG. 12. Thus, the connector housing 73a is formed with a single engagement portion 79 that conforms to the laser mark 76. The engagement portion 79 is also located radially outward of the through hole 712 and has a circular shape about the through hole 712. The width of the engagement portion 79 of the second embodiment is greater than the width of each engagement portion 77 of the first embodiment illustrated in FIG. 7.

As illustrated in FIG. 12, first projections 751 engage with first recesses 771, and second projections 752 engage with second recesses 772 at the joining region X2. Third projections 773 engage with grooves 71d. In this way the engagement portion 79 engages with the laser mark 76, so that an inverter cover 71 and the connector housing 73a are joined and integrated at the joining region X2. Other configurations of the electric compressor of the second embodiment are same as those of the electric compressor of the first embodiment. Therefore, such same configurations will be described using the same reference numerals and detailed description thereof will be omitted.

In the laser beam irradiation step according to the second embodiment, the laser irradiation device 100 is moved or shifted in the width direction of the first laser marks 76a, and then moved in the R1 direction while irradiating the base member 700 with the laser beam 101 so that the newly created first laser marks 76a extend along and partially overlap the previously formed first laser marks 76a. Thus, the width of the laser mark 76 may be increased without increasing the power of the laser beam 101 and therefore the area of engagement between the laser mark 76 and the engagement portion 79 may be increased. As a result, the joining and integration of the inverter cover 71 and the connector housing 73a at the joining region X2 is further enhanced. Other effects of the electric compressor of the second embodiment are same as those of the electric compressor of the first embodiment.

Third Embodiment

Figure 13:
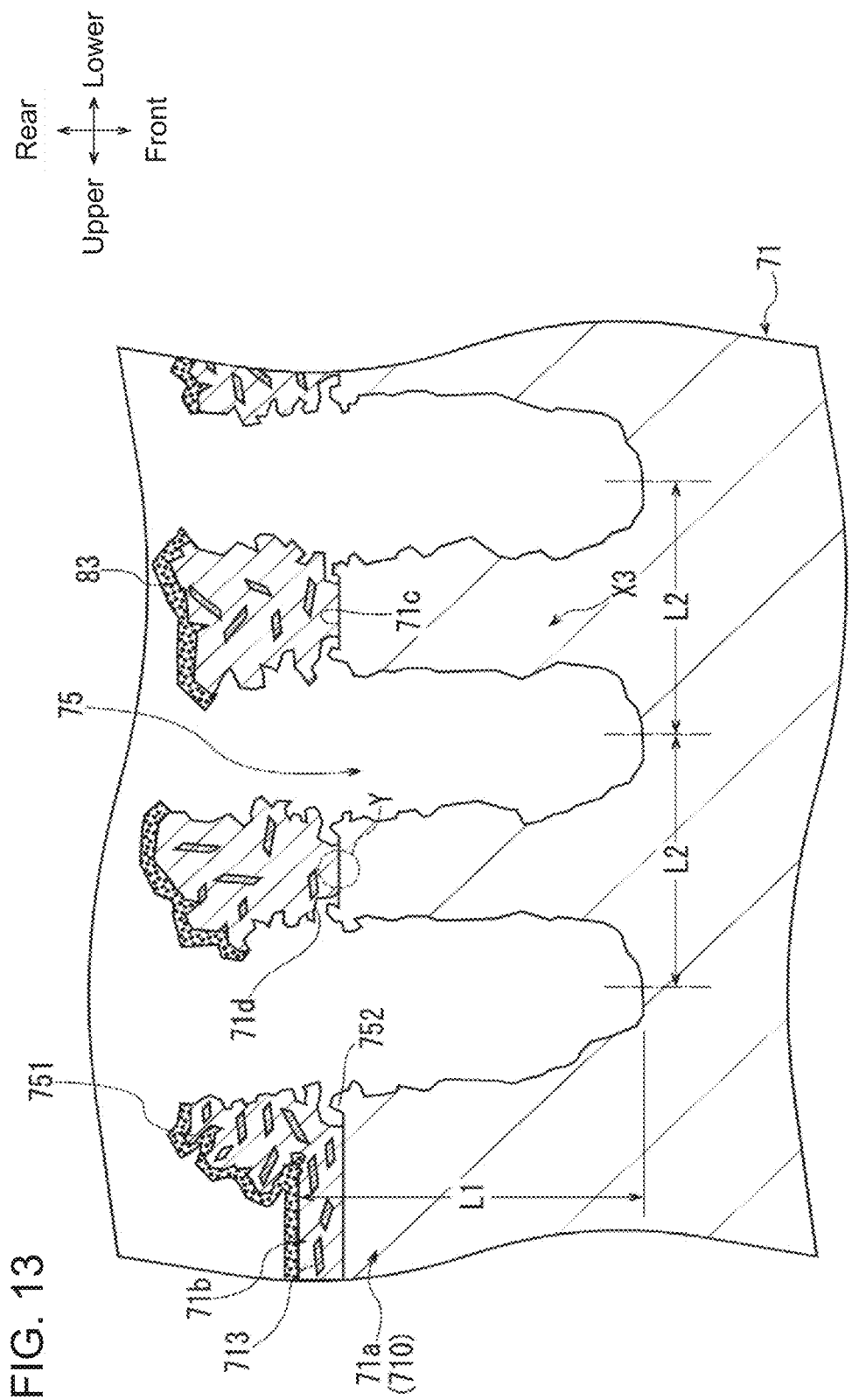
FIG. 13 is an enlarged fragmentary cross-sectional view of an electric compressor according to a third embodiment of the present disclosure, similar to FIG. 5.
Figure 14:
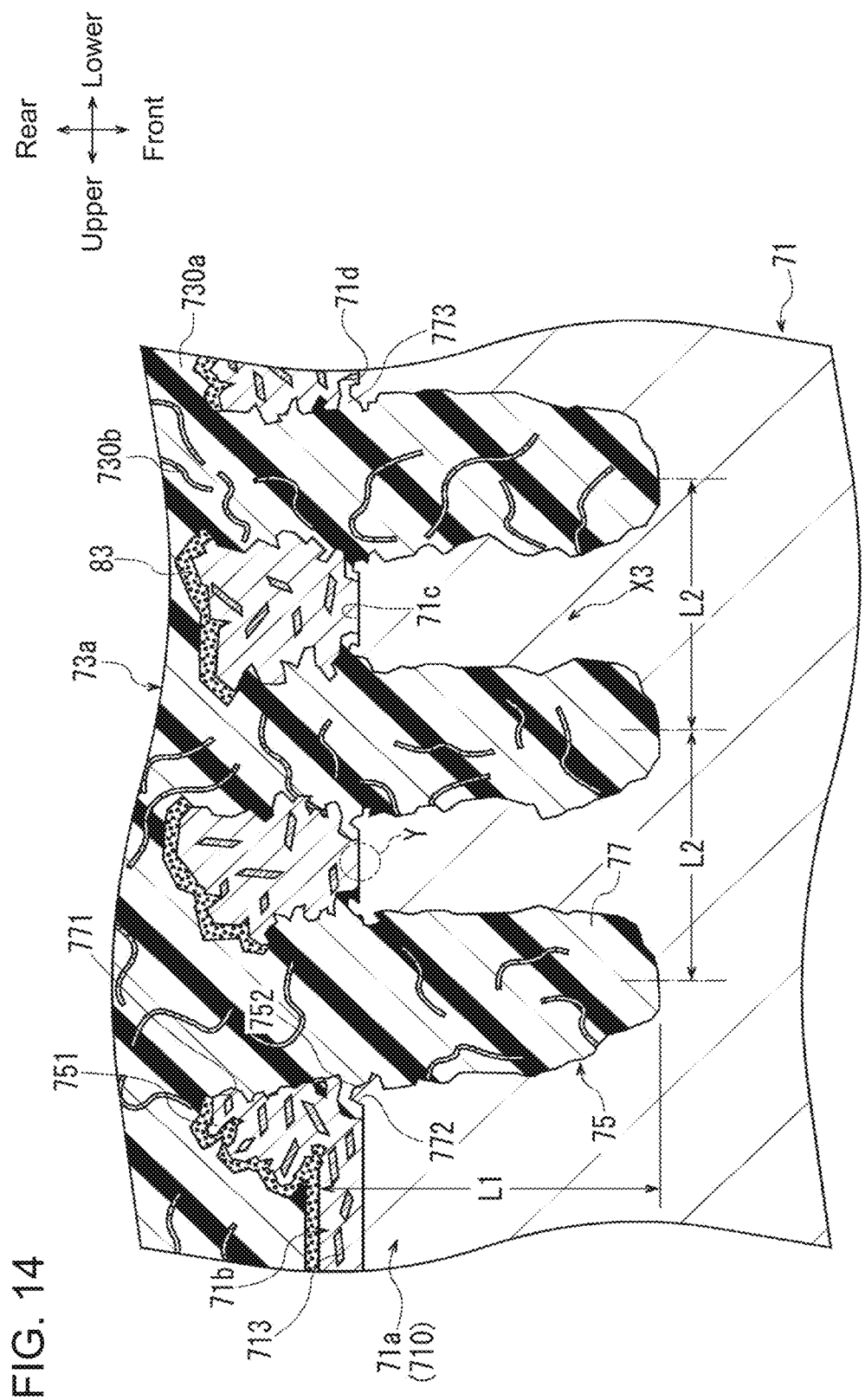
FIG. 14 is an enlarged fragmentary cross-sectional view of the inverter cover of the electric compressor of the third embodiment on which a connector housing is formed, as viewed in the same direction as FIG. 13.

As illustrated in FIGS. 13 and 14, in an electric compressor according to a third embodiment of the present disclosure, an inverter cover 71 and a connector housing 73a are integrated at a joining region X3. The joining region X3 further has a bonding layer 83, in addition to laser marks 75 and engagement portions 77.

Although not illustrated in detail in the drawings, a base member 700 that is prepared in the base member preparation step according to the third embodiment has a plating layer 71b which is coated with a bonding coat that constitutes the bonding layer 83. The bonding coat is applied to an area of the plating layer 71b that is located radially outward of a through hole 712. Part of the bonding coat that is irradiated with the laser beam 101 in the laser beam irradiation step is melted together with the base metal body 71a and the plating layer 71b. Therefore, in the inverter cover 71 of the third embodiment, the bonding layer 83 is not melted and remains in areas that are not irradiated with the laser beam 101, such as the areas between the laser marks 75, as illustrated in FIG. 13. In the subsequent connector housing forming step, a connector housing 73a is formed on the inverter cover 71. Thus, as illustrated in FIG. 14, engagement portions 77 are formed in the laser marks 75 and engage with the laser marks 75 at the joining region X3. At the same time, the connector housing 73a is bonded to the inverter cover 71 via the bonding layer 83. In this way the inverter cover 71 and the connector housing 73a are joined and integrated at the joining region X3. Other configurations of the electric compressor according to the third embodiment are same as those of the electric compressor according to the first embodiment.

The inverter cover 71 of the electric compressor according to the third embodiment has the bonding layer 83 at the joining region X3. Therefore, the joining and integration of the inverter cover 71 and the connector housing 73a at the joining region X3 is further enhanced. Furthermore, the area of the joining region X3 need not be increased owing to the bonding layer 83. Effects of the electric compressor according to the third embodiment are same as those of the electric compressor according to the first embodiment.

Although the first to third embodiments of the present disclosure have been described above, the present disclosure should not be construed as limited to these embodiments. The present disclosure may be modified variously within the scope of the present disclosure.

In an alternative, the bonding layer 83 may be provided to the joining region X2.

In an alternative, the laser marks 75 and the laser mark 76 may be used in combination.

In an alternative, the terminal mounting step may be performed after the connector housing forming step.

The present disclosure may be applied to electric equipment mounted on a vehicle or the like.

What is claimed is:

1. A cover assembly for on-board electric equipment, the cover assembly being configured to accommodate an electric circuit, comprising:
   a cover body; and
   a connector that is mounted to the cover body, includes a terminal and a connector housing, and electrically connects the electric circuit to an external component outside the cover assembly, wherein
   the cover body includes a ferrous base metal body, and a Zn-based plating layer joined to a surface of the base metal body that faces away from the electric circuit, wherein an interface is formed where the plating layer joins the base metal body,
   the cover body has a through hole that is formed through the base metal body and the plating layer,
   the terminal is passed through the through hole and electrically connected to the electric circuit,
   the connector housing is formed on the cover body so as to surround the terminal, wherein the connector housing is made of a thermoplastic resin-based material,
   a laser mark is formed on the cover body, wherein the laser mark has a circular shape about the through hole and penetrates the plating layer to the base metal body, grooves are formed on the interface and the grooves are open toward the laser mark, and
   the connector housing extends to the base metal body through the plating layer within the laser mark so that a part of the connector housing and the grooves are engaged with each other.

2. The cover assembly for on-board electric equipment according to claim 1, wherein the plating layer contains Al.

3. The cover assembly for on-board electric equipment according to claim 1, wherein
   the laser mark is a plurality of laser marks, and
   the laser marks are concentric with the through hole.

4. The cover assembly for on-board electric equipment according to claim 1, wherein
   the laser mark is a plurality of laser marks, and
   a region where the plating layer and the base metal body are joined is present between any two neighboring laser marks.

5. The cover assembly for on-board electric equipment according to claim 1, wherein the connector housing contains reinforcing fibers made of a material having a strength that is higher than a strength of the thermoplastic resin.

6. A method of manufacturing a cover assembly for on-board electric equipment configured to accommodate an electric circuit, the method comprising:
   preparing a base member, wherein the base member includes a ferrous base metal body, a Zn-based plating layer joined to a surface of the base metal body that faces away from the electric circuit, and a through hole that is formed through the base metal body and the plating layer, wherein an interface is formed where the plating layer joins the base metal body;
   irradiating the base member with a laser beam so that a circular laser mark is formed about the through hole, wherein the laser mark is formed to penetrate the plating layer to the base metal body, wherein grooves are formed on the interface and the grooves are open toward the laser mark;
   mounting a terminal to the through hole to electrically connect the electric circuit to an external component outside the cover assembly; and
   forming a connector housing such that the connector housing surrounds the terminal and that the connector housing extends to the base metal body through the plating layer within the laser mark so that a part of the connector housing and the grooves are engaged with each other, wherein the connector housing is made of a thermoplastic resin-based material.

* * * * *